United States Patent [19]
Yuji et al.

[11] Patent Number: 5,461,274
[45] Date of Patent: Oct. 24, 1995

[54] HUMIDITY-SENSITIVE ACTUATOR

[75] Inventors: Isogai Yuji, Irumagun; Hiroaki Yanagida, Chofushi; Masaru Miyayama, Kawasaki, all of Japan

[73] Assignee: Honda Giken Kogyo Kabushiki Kaisha, Tokyo, Japan

[21] Appl. No.: 209,782

[22] Filed: Mar. 11, 1994

[30] Foreign Application Priority Data

Mar. 11, 1993 [JP] Japan .................................. 5-050286
Nov. 4, 1993 [JP] Japan .................................. 5-275533

[51] Int. Cl.$^6$ ................................................ H01L 41/08
[52] U.S. Cl. ...................... 310/330; 310/358; 310/332; 73/29.05
[58] Field of Search ...................... 310/311, 328, 310/330–332, 358, 359; 73/29.02, 29.05, 335.06; 324/663

[56] References Cited

U.S. PATENT DOCUMENTS

| | | | |
|---|---|---|---|
| 3,671,784 | 6/1972 | Mitchell | 310/358 |
| 4,533,849 | 8/1985 | Schnell | 310/330 |
| 4,686,409 | 8/1987 | Kaarmann et al. | 310/358 |
| 4,928,264 | 5/1990 | Kahn | 310/358 X |
| 5,142,187 | 8/1992 | Saito et al. | 310/358 |
| 5,221,872 | 6/1993 | Nishida et al. | 310/358 |

Primary Examiner—Mark O. Budd
Attorney, Agent, or Firm—Lyon & Lyon

[57] ABSTRACT

A humidity-sensitive actuator includes a plate made of piezoelectric electrostrictive ceramic having a variable electric resistance region having a high moisture absorbing capability and defining a flat electrode attachment surface, and a high, fixed electric resistance region having a low moisture absorbing capability and defining a flat electrode attachment surface. The variable electric resistance region is joined to the high, fixed electric resistance region with electrodes on the flat electrode attachment surface on opposite sides of the plate for applying an electric voltage transversely through the plate. Under a high humidity condition, when the voltage is applied transversely across the plate through the electrodes by a power supply, an electric field is applied in different proportions to the variable and high, fixed electric resistance regions, which thereby contract by smaller and larger lengths, respectively, and produce a flexural displacement of the plate to serve as a humidity-sensitive actuator.

32 Claims, 5 Drawing Sheets

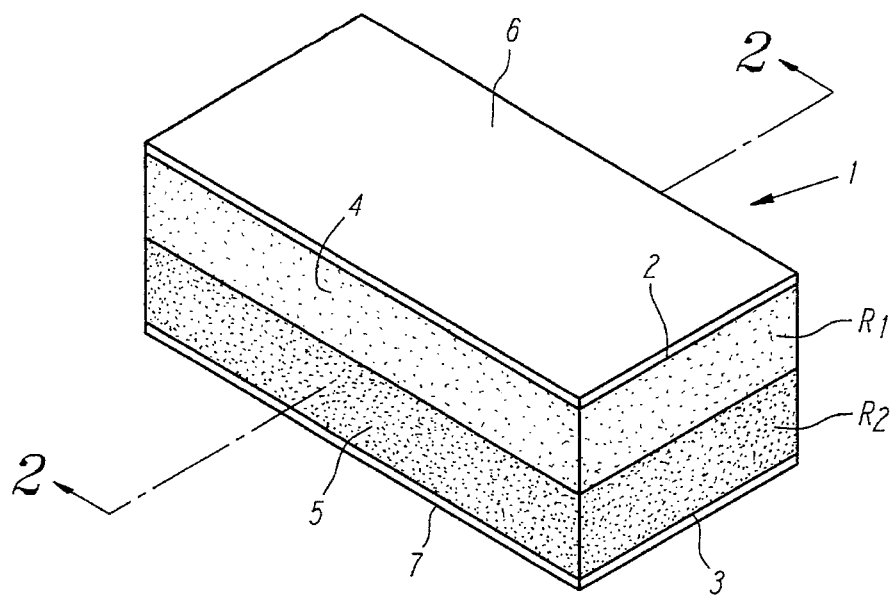
FIG. 1.
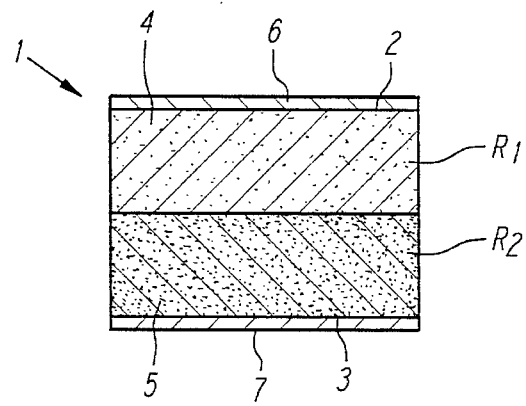
FIG. 2.
FIG. 8.
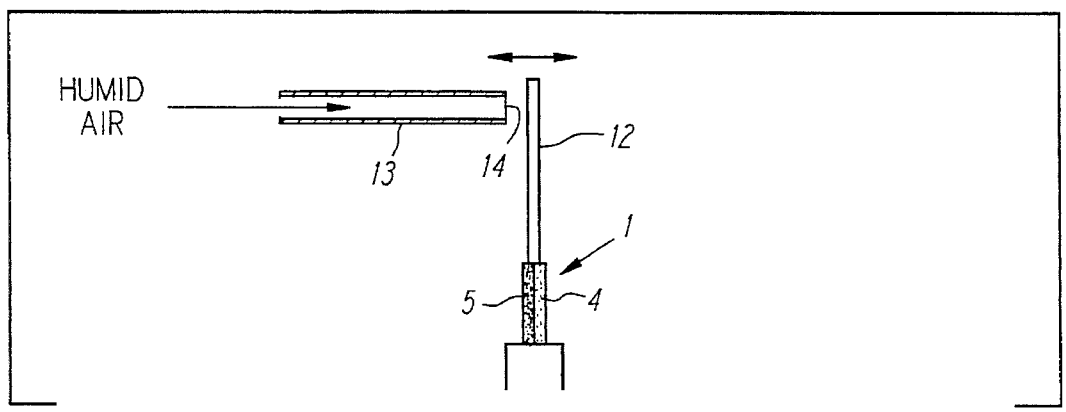

5,461,274

HUMIDITY-SENSITIVE ACTUATOR

BACKGROUND OF THE INVENTION

1. Field of the Invention

The present invention relates to a humidity-sensitive actuator, and more particularly to a humidity-sensitive actuator made of piezoelectric electrostrictive ceramic and capable of both detecting the humidity of a surrounding environment and producing a flexural deformation in response to the detected humidity.

2. Description of the Prior Art

Heretofore, humidity control apparatus such as airconditioning units, measuring instruments or the like have had a number of humidity sensors and a number of actuators separate from the humidity sensors and controllable in response to signals from the humidity sensors.

However, conventional humidity control apparatus have disadvantages because the wires and cables electrically connecting those humidity sensors and actuators to the control unit are highly complex, whereby the humidity control apparatus cannot easily be manufactured, inspected and repaired.

Among the prior art attempts to solve these problems, Japanese laid-open patent publication No. 1-109782 published Apr. 26, 1989 discloses a monomorph actuator comprising a piezoelectric element which produces a flexural displacement depending on the voltage applied thereto. Japanese laid-open patent publication No. 64-84762 published Mar. 30, 1989 shows a bimorph piezoelectric device composed of two piezoelectric elements joined to each other through a conductive leaf spring interposed therebetween and the bimorph piezoelectric device is flexed when a voltage is applied thereacross between the piezoelectric elements.

However, nothing in these publications shows or suggests a humidity-sensitive actuator which produces a flexural displacement depending on the humidity of a surrounding environment while a voltage is being applied across the humidity-sensitive actuator.

SUMMARY OF THE INVENTION

It is therefore an object of the present invention to provide a humidity-sensitive actuator capable of both detecting the humidity of a surrounding environment and producing a flexural deformation in response to the detected humidity.

According to the present invention, there is provided a humidity-sensitive actuator comprising a plate made of piezoelectric electrostrictive ceramic having a variable electric resistance region with a higher moisture-absorbing capability and defining a flat electrode attachment surface, and a high and fixed electric resistance region having a lower moisture absorbing capability and defining a flat electrode attachment surface, the variable electric resistance region being joined to the high and fixed electric resistance region.

The variable electric resistance region may comprise a porous piezoelectric electrostrictive ceramic plate and the high and fixed electric resistance region may comprise a dense piezoelectric electrostrictive ceramic plate joined to the porous piezoelectric electrostrictive ceramic plate. The porous piezoelectric electrostrictive ceramic plate may be made of PZT having a portion replaced with an amount of $Nb_2O_5$ which is equal to or smaller than 2 mole %. The dense piezoelectric electrostrictive ceramic plate may be made of PZT. The porous piezoelectric electrostrictive ceramic plate may have a relative density of about 62%, and the dense piezoelectric electrostrictive ceramic plate may have a relative density of about 99%.

An electric field is applied in a transverse direction across the humidity-sensitive actuator by a power supply through respective electrodes on the flat electrode attachment surfaces. When the humidity of the surrounding environment is relatively low, the electric resistances of the piezoelectric electrostrictive ceramic plates are relatively high and substantially equal to each other. Therefore, the electric field is applied in substantially the same proportions to the piezoelectric electrostrictive ceramic plates, which plates are thus contracted substantially the same length in directions perpendicular to the transverse direction.

When the humidity of the surrounding environment becomes higher, the porous piezoelectric electrostrictive ceramic plate absorbs more moisture, and hence its electric resistance is lowered. On the other hand, the dense piezoelectric electrostrictive ceramic plate absorbs less moisture than the porous piezoelectric electrostrictive ceramic plate, and hence its electric resistance is maintained at a relatively high level. As a result, the electric field is applied in a greater proportion to the dense piezoelectric electrostrictive ceramic plate than to the porous piezoelectric electrostrictive ceramic plate. The porous and dense piezoelectric electrostrictive ceramic plates are thus contracted smaller and larger lengths, respectively, in the directions perpendicular to the transverse direction. Therefore, the humidity-sensitive actuator is flexed such that the flat electrode attachment surface of the dense piezoelectric electrostrictive ceramic plate becomes concave outwardly and the flat electrode attachment surface of the porous piezoelectric electrostrictive ceramic plate becomes convex outwardly. Such a flexural displacement of the humidity-sensitive actuator may be used to actuate a mechanism in a humidity control apparatus, e.g., to open or close a valve in an air-conditioning unit, for example.

According to the present invention, there is also provided a humidity-sensitive actuator comprising a first plate made of porous piezoelectric electrostrictive ceramic having a lower relative density for absorbing more moisture, a second plate made of dense piezoelectric electrostrictive ceramic having a higher relative density for absorbing less moisture, the first and second plates having joined surfaces, respectively, a first electrode mounted on a surface of the first plate opposite to the joined surface thereof, and a second electrode mounted on a surface of the second plate opposite to the joined surface thereof.

According to the present invention, there is further provided a humidity-sensitive actuator comprising a plate of piezoelectric electrostrictive ceramic having a relative density gradient for producing different moisture-dependent electric resistances transversely thereacross, a pair of electrodes mounted respectively on opposite surfaces of the plate, and power supply means for applying a constant voltage across the plate through the electrodes to develop an electric field gradient transversely across the plate depending on the different moisture-dependent electric resistances, whereby the plate can produce a flexural displacement due to the electric field gradient.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 1 is a perspective view of a humidity-sensitive actuator according to the present invention;

FIG. 2 is a transverse cross-sectional view taken along line II—II of FIG. 1;

FIG. 8 is a schematic side elevational view, partly in cross section, of an application of the humidity-sensitive actuator;

DETAILED DESCRIPTION OF THE PREFERRED EMBODIMENT

Figure 3A:
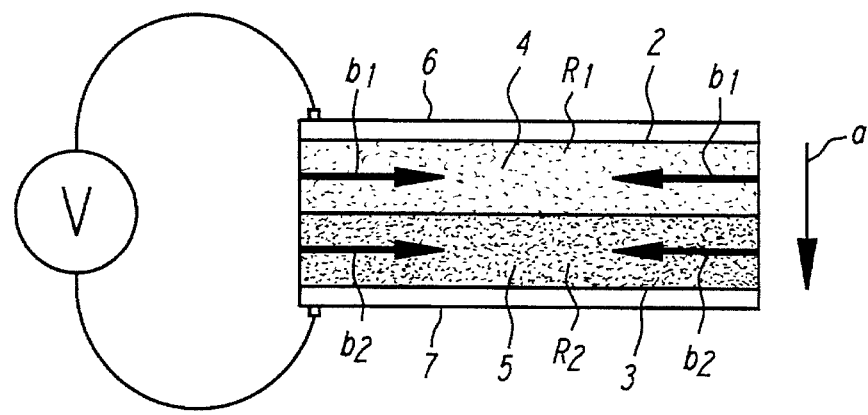
FIGS. 3A, 3B, and 3C are cross-sectional views showing the manner in which the humidity-sensitive actuator operates.

As shown in FIGS. 1 and 2, a humidity-sensitive actuator 1 according to the present invention is in the form of a composite plate made of piezoelectric electrostrictive ceramic. The humidity-sensitive actuator 1 includes a variable electric resistance region $R_1$ having a high moisture absorbing capability and defining a flat electrode attachment surface 2, and a high and fixed electric resistance region $R_2$ having a low moisture-absorbing capability and defining a flat electrode attachment surface 3. The variable electric resistance region $R_1$ is joined to the high, fixed electric resistance region $R_2$.

The variable electric resistance region $R_1$ comprises a sintered porous piezoelectric electrostrictive ceramic plate 4. The high, fixed electric resistance region $R_2$ comprises a sintered dense piezoelectric electrostrictive ceramic plate 5. The piezoelectric electrostrictive ceramic plates 4, 5 have confronting surfaces joined in face-to-face relationship to each other by diffusion bonding or a sintering bond, with the flat electrode attachment surfaces 2, 3 facing away from each other.

The sintered porous piezoelectric electrostrictive ceramic plate 4 is made of PZT, i.e., lead zirconium titanate (pb(Zr, Ti)O$_3$), having a high dielectric constant and a high electrostrictive effect, or PZT having a portion replaced with niobium oxide (Nb$_2$O$_5$). The niobium oxide is capable of suppressing the fired densification of the piezoelectric electrostrictive ceramic plate 4 to lower its relative density Dr. The piezoelectric electrostrictive ceramic plate 4 can be made porous if it is made of PZT only. However, it can be made porous relatively easily if it is made of PZT partially replaced with niobium oxide (Nb$_2$O$_5$). For achieving a desired degree of porosity, it is preferable to replace a portion of PZT with an amount of niobium oxide (Nb$_2$O$_5$) which is equal to less than 2 mole %. If replaced with an amount of niobium oxide (Nb$_2$O$_5$) greater than 2 mole %, then the piezoelectric electrostrictive ceramic plate 4 maybe become too brittle.

The ability of the porous piezoelectric electrostrictive ceramic plate 4 to absorb moisture is governed by the relative density Dr thereof. Depending on the electric field applied, the relative density Dr of the porous piezoelectric electrostrictive ceramic plate 4 falls in the range of $60\% \leq Dr \leq 90\%$. With the relative density Dr in this range, the porous piezoelectric electrostrictive ceramic plate 4 can have a higher moisture absorption capability than the dense piezoelectric electrostrictive ceramic plate 5.

The dense piezoelectric electrostrictive ceramic plate 5 preferably is made of only PZT. Preferably, the relative density Dr thereof is equal to or greater than 90% to sufficiently lower the moisture absorption capability of the dense piezoelectric electrostrictive ceramic plate 5.

Flat electrodes 6, 7 are attached respectively to the flat electrode attachment surfaces 2, 3. The electrodes 6, 7 are made of Ag, Au, Pt, an In - Ga alloy, or the like, and joined to the flat electrode attachment surfaces 2, 3 by evaporation, firing, or the like.

Figure 3B:
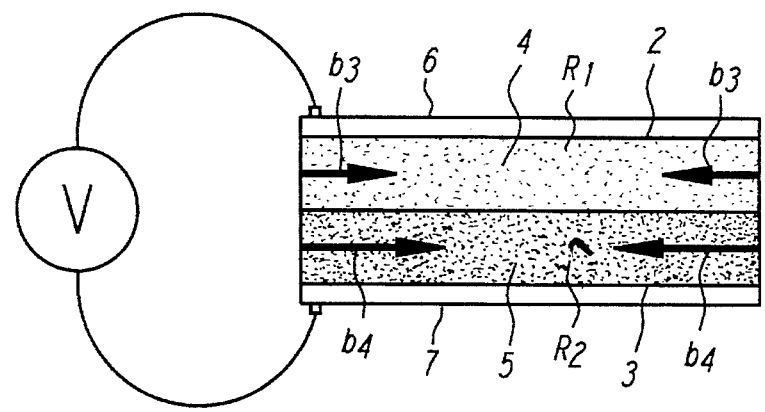
Figure 3C:
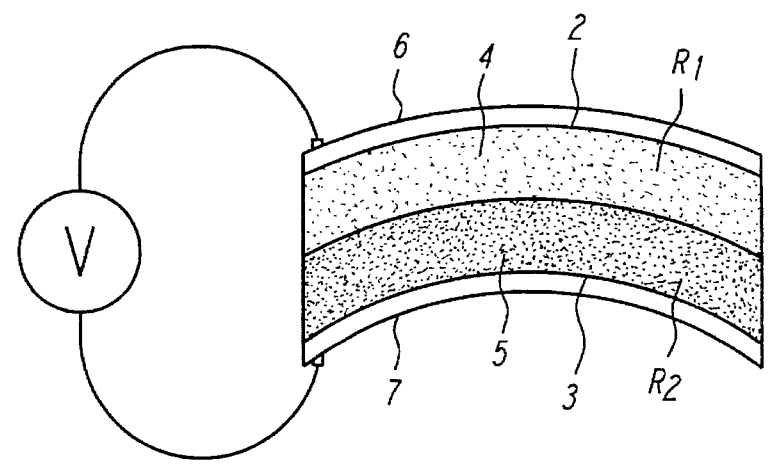

Operation of the humidity-sensitive actuator 1 now will be described with reference to FIGS. 3A through 3C. As shown in FIG. 3A, an electric field is applied in a transverse direction indicated by the arrow "a" across the humidity-sensitive actuator 1 by a power supply V through the electrodes 6, 7 on the flat electrode attachment surfaces 2, 3. When the humidity of the surrounding environment is relatively low, the electric resistances of the piezoelectric electrostrictive ceramic plates 4, 5 are relatively high and substantially equal to each other. Therefore, the electric field is applied in substantially the same proportions to the piezoelectric electrostrictive ceramic plates 4, 5, which are thus contracted substantially the same lengths $b_1$, $b_2$ in directions perpendicular to the direction "a".

When the humidity of the surrounding environment becomes higher, the porous piezoelectric electrostrictive ceramic plate 4 absorbs moisture, and hence its electric resistance is lowered. On the other hand, the dense piezoelectric electrostrictive ceramic plate 5 absorbs less moisture than the porous piezoelectric electrostrictive ceramic plate 4, and hence its electric resistance is maintained at a relatively high level. As a result, the electric field is applied in greater proportion to the dense piezoelectric electrostrictive ceramic plate 5 than to the porous piezoelectric electrostrictive ceramic plate 4. As shown in FIG. 3B, the piezoelectric electrostrictive ceramic plates 4, 5 are thus contracted smaller and larger lengths $b_3$, $b_4$, respectively, in the directions perpendicular to the direction "a". Therefore, as shown in FIG. 3C, the humidity-sensitive actuator 1 is flexed such that the flat electrode attachment surface 3 of the dense piezoelectric electrostrictive ceramic plate 5 becomes concave outwardly and the flat electrode attachment surface 2 of the porous piezoelectric electrostrictive ceramic plate 4 becomes convex outwardly. Such a flexural displacement of the humidity-sensitive actuator 1 may be used to actuate a mechanism in a humidity control apparatus, e.g., to open or close a valve in an air-conditioning unit, for example.

Example I:

(a) Humidity-sensitive characteristics of porous piezoelectric electrostrictive ceramic plates:

Powders of PbO, $ZrO_2$, $TiO_2$ and $Nb_2P_5$ whose purity is of a special grade, were weighed such that the composition of PZT containing Nb would be $Pb_{0.995}Nb_{0.01}(Zr_{0.53}Ti_{0.47})_{0.99}O_3$ (the numerical values represent mole %, and the amount of replacing $Nb_2P_5$ is 1 mole %). The weighed powders were mixed by a ball mill, and the mixture was calcined in an atmospheric furnace at 850° C. for six hours. The calcined mass was then crushed into a calcined powder having an average particle diameter of 1.4 μm. The calcined powder was molded into a plurality of powder-molded pieces under a molding pressure of 0.5 t/cm². The powder-molded pieces were sintered in an atmospheric furnace at different temperatures in the range of from 900 to 1050° C. for two hours, thus producing a plurality of sintered pieces of PZT containing Nb and having different relative densities Dr. The sintered pieces of PZT were machined into respective circular piezoelectric electrostrictive ceramic plates each having a diameter of 9 mm and a thickness of 1 mm.

The Table, shown below, shows the relationship between the sintering temperatures of the produced piezoelectric electrostrictive ceramic plates, indicated respectively by (1)~(4) below, and their relative densities Dr.

TABLE

| Piezoelectric electrostrictive ceramic plate | Sintering temperature (°C.) | Relative density Dr (%) |
| --- | --- | --- |
| (1) | 900 | 70 |
| (2) | 930 | 73 |
| (3) | 950 | 75 |
| (4) | 1050 | 97 |

It can be seen from the above Table that, where the amount of replacing $Nb_2P_5$ is 1 mole %, the relative density Dr of a piezoelectric electrostrictive ceramic plate increases as the sintering temperature rises.

Then, electrodes of Au were evaporated onto both sides of each of the piezoelectric electrostrictive ceramic plates (1)~(4). Thereafter, the piezoelectric electrostrictive ceramic plates (1)~(4) were tested for humidity-sensitive characteristics to determine the relationship between the relative humidity and the specific resistance thereof. The results of the test are shown in FIG. 4.

In the humidity-sensitive characteristics test, a constant DC bias voltage of 5 V was applied between the electrodes to apply an electric field of 50 V/cm, and the relative humidity was varied in the range of from 10 to 90% at a temperature of 25° C. During the tests, currents flowing through the piezoelectric electrostrictive ceramic plates (1)~(4) were measured by an electrometer. The specific resistances were calculated on the basis of the measured currents.

Figure 4:
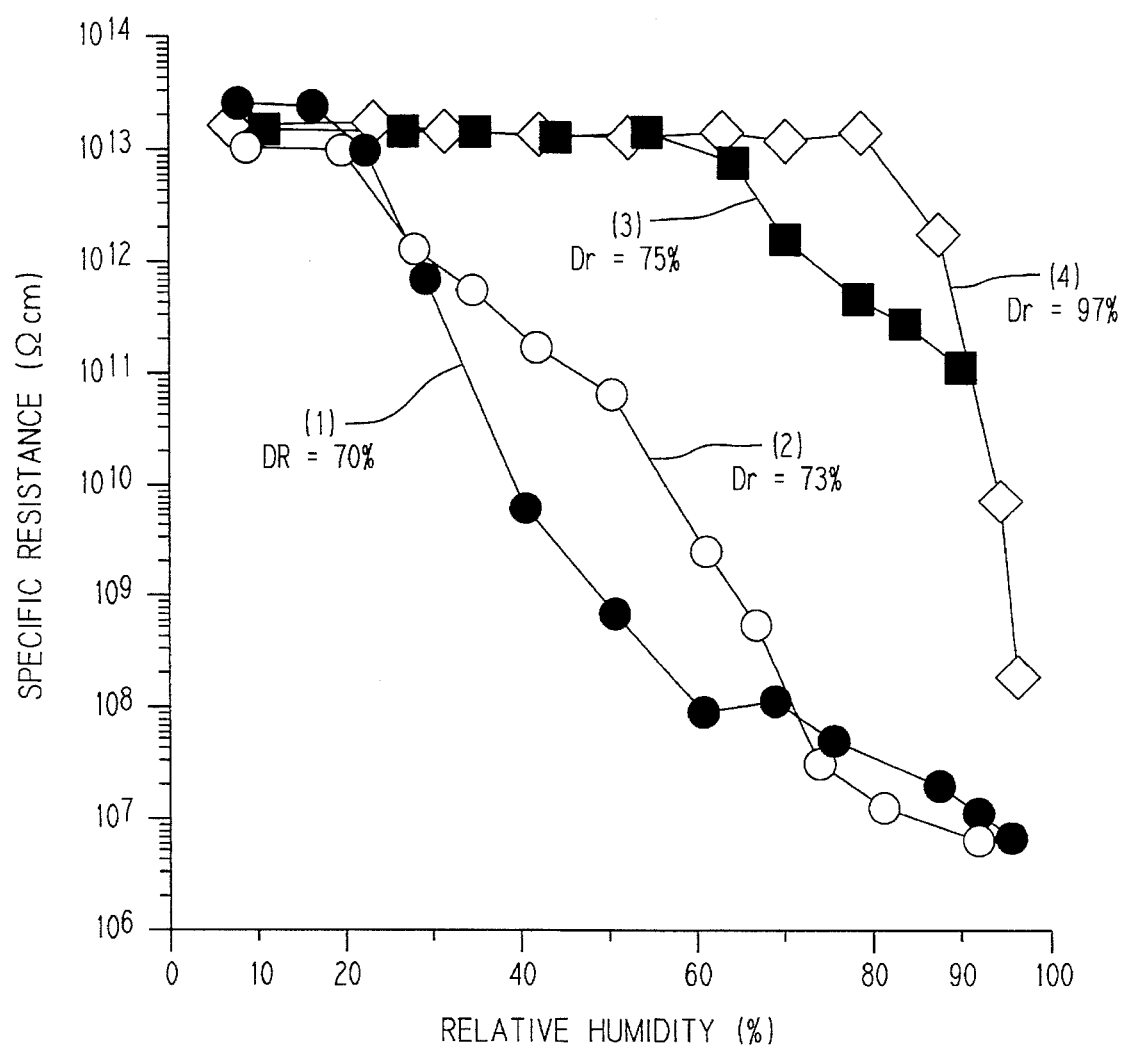
FIG. 4 is a graph showing the relationship between the relative humidity and the specific resistance of plates of porous piezoelectric electrostrictive ceramic.

In FIG. 4, curves (1)~(4) represent the relative humidity vs. specific resistance characteristics of the piezoelectric electrostrictive ceramic plates (1)~(4), respectively. Desired humidity-sensitive characteristics are obtained over a wide humidity range if the relative density Dr is equal to or lower than 75% as with the piezoelectric electrostrictive ceramic plates (1)~(3). Particularly, the piezoelectric electrostrictive ceramic plates (1), (2) whose relative density Dr is equal to or lower than 75% exhibit distinctive humidity-sensitive characteristics where their specific resistance drops from $10^{13}$ Ωcm to $10^7$ Ωcm as the relative humidity increases.

The measured data shown in FIG. 4 were produced when the DC bias voltage was 5 V and hence the applied electric field was 50 V/cm. If the applied electric field was increased, then the piezoelectric electrostrictive ceramic plate whose relative density Dr is higher than 75% would exhibit the desired humidity-sensitive characteristics.

(b) The relationship between the flexural displacement and the relative humidity of humidity-sensitive actuators:

Powders of PbO, $ZrO_2$, and $TiO_2$ were weighed such that the composition of PZT would be Pb $(Zr_{0.53}Ti_{0.47})O_3$ (the numerical values represent mole %). The weighed powders were successively mixed, calcined and crushed in the same manner as described above, thus producing a calcined powder having an average particle diameter of 1.4 μm.

The calcined powder was molded into a circular powder-molded piece having a diameter of 15 mm and a thickness of 1 mm under a molding pressure of 0.5 t/cm². The circular powder-molded piece was sintered in an atmospheric furnace in a temperature range from 1050° to 1158° C. for two hours, thus producing a sintered piece of PZT having a relative density Dr of 99%. This high-density sintered piece of PZT corresponds to the dense piezoelectric electrostrictive ceramic plate 5.

The calcined powder described in the section (a) above was molded into a circular powder-molded piece having a diameter of 15 mm and a thickness of 1 mm under a molding pressure of 0.5 t/cm². One surface of the circular powder-molded piece was placed over one surface of the high-density sintered piece of PZT with zircon frit (manufactured by Japan Enamel Glaze Co., Ltd. under No. 7321) as a sintering bond interposed therebetween. The assembly was pressed by hot pressing at a temperature of 770° C. under a pressure ranging from 80 to 100 kgf/cm² for one hour, producing a low-density sintered piece of PZT containing Nb having a relative density Dr of 73% from the powder-molded piece. Then the low-density sintered piece of PZT containing Nb was joined to the high-density sintered piece of PZT, thereby obtaining a laminated body. This low-density sintered piece of PZT containing Nb corresponds to the porous piezoelectric electrostrictive ceramic plate 4.

Figure 5:
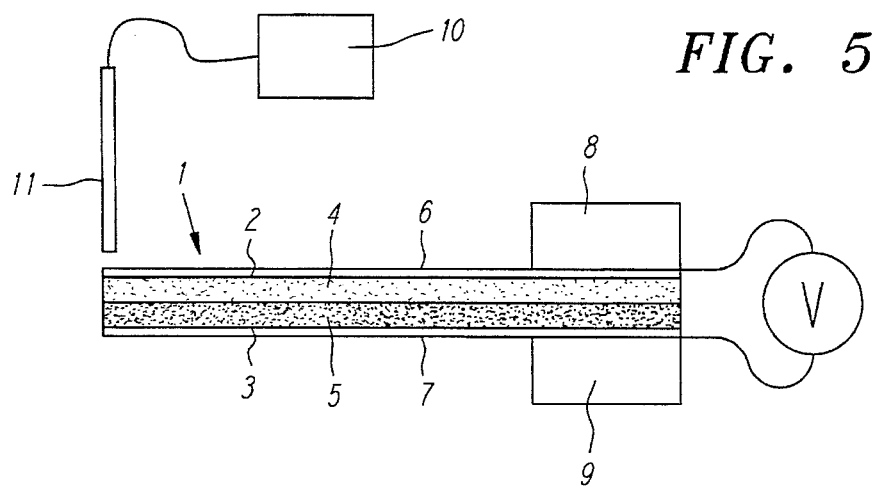
FIG. 5 is a schematic diagram illustrating a process of measuring a flexural displacement of a humidity-sensitive actuator.

The laminated body was then machined into a humidity-sensitive actuator 1 having a width of 4.5 mm, a thickness of 1 mm, and a length of 10 mm as shown in FIG. 5. The porous piezoelectric electrostrictive ceramic plate 4 and the dense piezoelectric electrostrictive ceramic plate 5 each had a resultant thickness of 0.5 mm. A paste material containing Ag was coated on each of the flat electrode attachment surfaces 2, 3 of the humidity-sensitive actuator 1 and fired, thereby to produce Ag electrodes 6, 7. A 4 mm end portion of the humidity-sensitive actuator was gripped by holder members 8, 9. A probe 11 of a photonic sensor 10 was positioned near the porous piezoelectric electrostrictive ceramic plate 4 at the opposite longitudinal end of the humidity-sensitive actuator 1.

Figure 6:
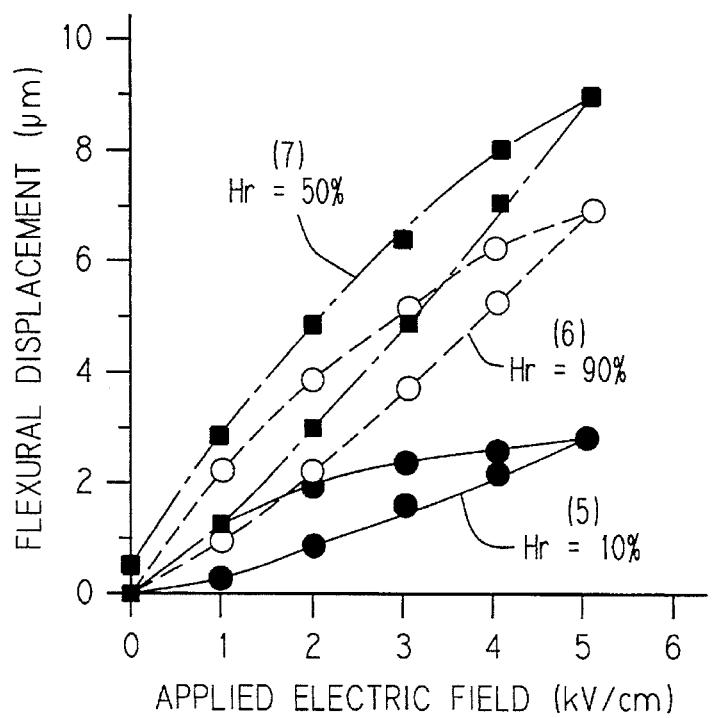
FIG. 6 is a graph showing the relationship between the electric field applied to the humidity-sensitive actuator and the flexural displacement of that actuator shown in FIG. 5.

The relative humidity was set to 10%, 30% and 50% at a temperature of 18° C., and an electric field that varied stepwise from 0 kV/cm to 5 kV/cm to 0 kV/cm was applied between the flat electrode attachment surfaces 2, 3 through the electrodes 6, 7 by the power supply V. Flexural displacements of the humidity-sensitive actuator 1 which were caused under the above conditions were detected by the photonic sensor 10. The relationship between the applied electric field and the flexural displacement at the various relative humidities is shown in FIG. 6. In FIG. 6, a solid-line curve (5) represents the relationship between the applied electric field and the flexural displacement when the relative humidity Hr was 10%, a dot-and-dash-line curve (6) represents the relationship between the applied electric field and the flexural displacement when the relative humidity Hr was 30%, and a two-dot-and-dash-line curve (7) represents the relationship between the applied electric field and the flexural displacement when the relative humidity Hr was 50%.

A study of FIG. 6 indicates that as the relative humidity Hr increases, the flexural displacement of the humidity-sensitive actuator 1 also increases. It can also be seen from FIG. 6 that at each of the relative humidities, the flexural displacement of the humidity-sensitive actuator 1 varies along a hysteresis loop as the applied electric field varies. For this reason, the humidity-sensitive actuator 1 should preferably be made of those materials which are free of hysteresis as much as possible for higher operation accuracy.

Figure 7:
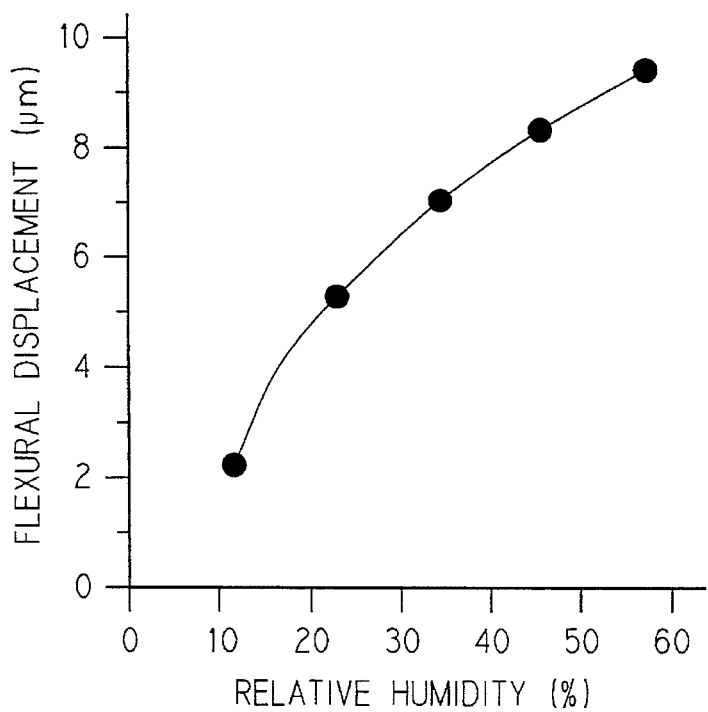
FIG. 7 is a graph showing the relationship between the relative humidity and the flexural displacement of the humidity-sensitive actuator shown in FIG. 5.

Then a constant electric field of 5 kV/cm was applied between the flat electrode attachment surfaces 2, 3 through the electrodes 6, 7 by the power supply V, and the relative humidity varied in the range of from 10 to 50%, flexural displacements of the humidity-sensitive actuator 1 were detected by the photonic sensor 10. The relationship between the relative humidity and the flexural displacement under the constant electric field is shown in FIG. 7. It will be understood from FIG. 7 that the flexural displacement of the humidity-sensitive actuator 1 becomes larger as the relative humidity increases.

FIG. 8 shows an application of the humidity-sensitive actuator 1 by way of example. In FIG. 8, a valve body 12 in the form of a resilient plate is attached at an end thereof to one end of the humidity-sensitive actuator 1. The opposite end of the valve body 12 is positioned near and in front of an outlet port 14 defined in an end of a conduit 13 for supplying humid air. When the humidity of the surrounding environment reaches a predetermined value, the humidity is detected by the humidity-sensitive actuator 1 and the humidity-sensitive actuator 1 is flexurally displaced, causing the valve body 12 to close the outlet port 14. Therefore, the humidity-sensitive actuator 1 can control the supply of humid air from the conduit 13 depending on the humidity of the surrounding environment. The humidity-sensitive actuator 1 itself serves as both a humidity sensor and an actuator flexurally displaceable in response to a humidity detected by the humidity sensor. Consequently, where a humidity control apparatus such as an air-conditioning unit or the like employs such humidity-sensitive actuators, wires and cables used in the air-conditioning unit may be simplified, so that the air-conditioning unit can be manufactured, inspected and repaired with utmost ease.

Example II:

(a) Humidity-sensitive characteristics of porous piezoelectric electrostrictive ceramic plates:

Powders of PbO, ZrO$_2$, TiO$_2$, and Nb$_2$O$_5$, whose purity is of a special grade, were weighed such that the composition of PZT containing Nb would be Pb$_{0.995}$Nb$_{0.01}$(Zr$_{0.53}$Ti$_{0.47}$)$_{0.99}$O$_3$ (the numerical values represent mole %, and the amount of replacing Nb2O5 is 1 mole %). The weighed powders were mixed by a ball mill, and the mixture was calcined in an atmospheric furnace at 850° C. for six hours. The calcined mass was then crushed into a calcined powder having an average particle diameter of 0.5 µm. The calcined powder was molded into a plurality of circular powder-molded pieces under a molding pressure of 0.5 t/cm$^2$, the powder-molded pieces each having a diameter of 15 mm and a thickness of 1 mm.

Powders of PbO, ZrO$_2$ and TiO$_2$ were weighed such that the composition of PZT would be Pb(Zr$_{0.53}$Ti$_{0.47}$)O$_3$ (the numerical values represent mole %). The weighed powders were successively mixed, calcined and crushed in the same manner as described above, thus producing a calcined powder having an average particle diameter of 1.4 µm. The calcined powder was molded into a plurality of circular powder-molded pieces each having a diameter of 15 mm and a thickness of 1 mm under a molding pressure of 0.5 t/cm$^2$. The circular powder-molded pieces were sintered in an atmospheric furnace in a temperature range from 1050 to 1158° C. for two hours, thus producing a plurality of sintered pieces of PZT having a relative density Dr of 99%. These high-density sintered pieces of PZT correspond to the dense piezoelectric electrostrictive ceramic plate 5.

One surface of each of the circular powder-molded pieces was placed over one surface of each of the respective high-density sintered pieces of PZT with zircon frit (manufactured by Japan Enamel Glaze Co., Ltd. under No. 7321) as a sintering bond interposed therebetween. The assemblies were pressed by hot pressing at a sintering temperature Ts of 750° C. or 795° C. under a pressure ranging from 80 to 100 kgf/cm$^2$ for one hour, thereby producing low-density sintered pieces of PZT containing Nb from the circular powder-molded pieces. Then, these low-density sintered pieces of PZT containing Nb were joined to the respective high-density sintered pieces of PZT, thereby obtaining laminated bodies. The low-density sintered pieces of PZT containing Nb correspond to the porous piezoelectric electrostrictive ceramic plate 4. The relative density Dr of the porous piezoelectric electrostrictive ceramic plate 4 was 62% when the sintering temperature Ts was 750° C., and 78% when the sintering temperature Ts was 795° C.

In order to check porous piezoelectric electrostrictive ceramic plates for humidity-sensitive characteristics, the laminated bodies were machined into respective porous piezoelectric electrostrictive ceramic plates each having a width of 5 mm, a thickness of 1 mm, and a length of 5 mm. Then, electrodes of Au were evaporated on both sides of each of the piezoelectric electrostrictive ceramic plates. Thereafter, the piezoelectric electrostrictive ceramic plates were tested for humidity-sensitive characteristics to determine the relationship between the relative humidity and the specific resistance thereof. The results of the test are shown in FIG. 9.

In the humidity-sensitive characteristics test, a constant DC bias voltage of 50 V was applied between the electrodes to apply an electric field of 500 V/cm, and the relative humidity was varied in the range of from 2 to 83% at a temperature of 25° C. The currents flowing through the piezoelectric electrostrictive ceramic plates were measured by an electrometer. The specific resistances were calculated on the basis of the measured currents.

Figure 9:
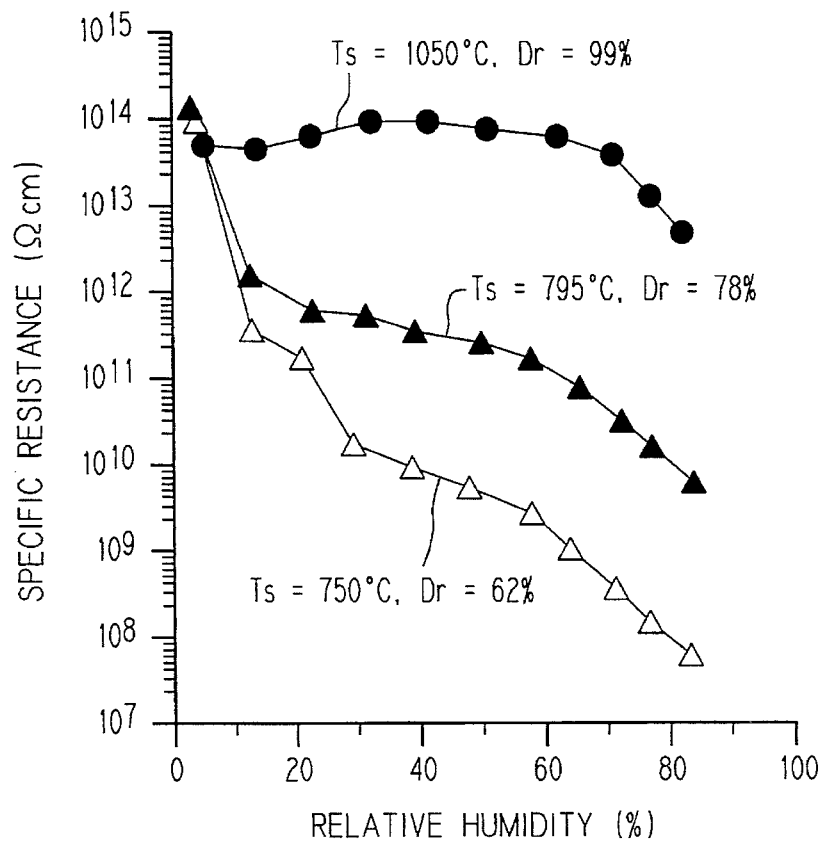
FIG. 9 is a graph showing the relationship between the relative humidity and the specific resistance of plates of porous piezoelectric electrostrictive ceramic.

It can be seen from FIG. 9 that the piezoelectric electrostrictive ceramic plate sintered at a sintering temperature Ts of 750° C. and having a relative density Dr of 62% exhibits a larger resistance change as the relative humidity varies, and the piezoelectric electrostrictive ceramic plate sintered at a sintering temperature Ts of 795° C. and having a relative density Dr of 78% exhibits a relatively gradual resistance change as the relative humidity varies. In FIG. 9, a curve indicated by Ts=1050° C., Dr=99% represents the humidity-sensitive characteristics of a dense piezoelectric electrostrictive ceramic plate, indicating that its specific resistance remains substantially unchanged as the relative humidity varies.

(b) The relationship between the flexural displacement and the relative humidity of humidity-sensitive actuators:

The above laminated bodies were also machined into respective humidity-sensitive actuators 1 each having a width of 3 mm, a thickness of 1 mm, and a length of 11 mm as shown in FIG. 5. The porous piezoelectric electrostrictive ceramic plate 4 and the dense piezoelectric electrostrictive ceramic plate 5 each had a thickness of 0.5 mm. A paste material containing Ag was coated on each of the flat electrode attachment surfaces 2, 3 of the humidity-sensitive actuators 1, and fired thereby to produce Ag electrodes 6, 7. A 4 mm end portion of each of the humidity-sensitive actuators 1 was gripped by holder members 8, 9. A probe 11 of a photonic sensor 10 was positioned near the porous piezoelectric electrostrictive ceramic plate 4 at the opposite longitudinal end of each humidity-sensitive actuator 1.

A constant electric field of 4 kV/cm was applied between the flat electrode attachment surfaces 2, 3 through the electrodes 6, 7 by the power supply V, and the relative humidity was varied in the range of from 10 to 70%. Flexural displacements of the humidity-sensitive actuators 1 which were caused under the above conditions were detected by the photonic sensor 10. The relationship between the applied relative humidity and the flexural displacement is shown in FIG. 10.

Figure 10:
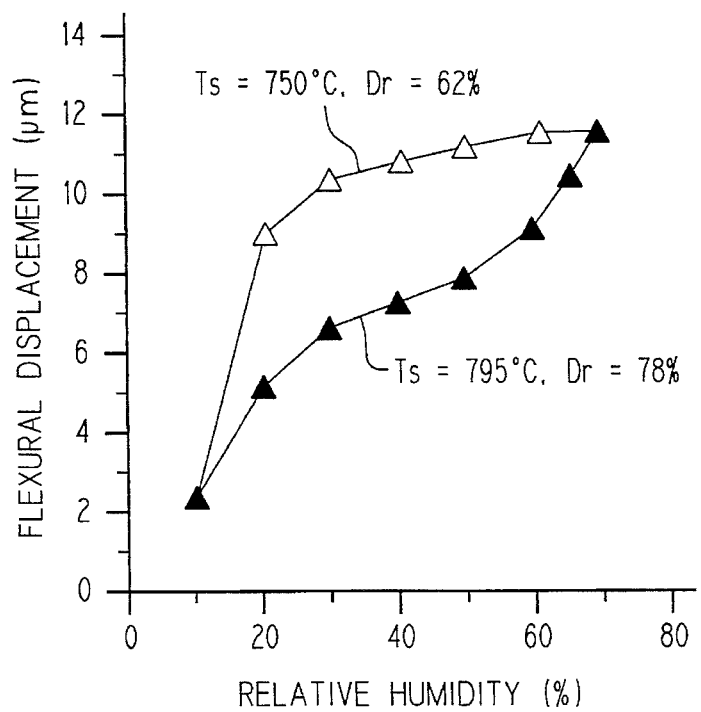
FIG. 10 is a graph showing the relationship between the relative humidity and the flexural displacement of humidity-sensitive actuators.

In FIG. 10, the humidity-sensitive actuator 1 having the porous piezoelectric electrostrictive ceramic plate 4 sintered at a sintering temperature Ts of 795° C. and having a relative density Dr of 78% exhibits a more gradual flexural displacement as the relative humidity becomes higher. However, the humidity-sensitive actuator 1 having the porous piezoelectric electrostrictive ceramic plate 4 sintered at a sintering temperature Ts of 750° C. and having a relative density Dr of 62% exhibits a large linear flexural displacement in a relative humidity range of from 10 to 20%. Based on this flexural displacement property, the humidity-sensitive actuator 1 may be used to control the humidity in a desiccator, for example.

It can be seen from Example II that varying the sintering temperature Ts in hot pressing the piezoelectric electrostrictive ceramic plate 4 makes it possible to produce a humidity-sensitive actuator having linear or nonlinear humidity-sensitive characteristics.

While a powder-molded piece is joined to a sintered piece to manufacture a humidity-sensitive actuator in each of Examples I and II given above, two powder-molded pieces may be joined to each other at the same time that they are sintered. The composite plate of piezoelectric electrostrictive ceramic of the humidity-sensitive actuator according to the present invention may be constructed to have its relative density Dr progressively increasing or decreasing from one flat electrode attachment surface to the opposite flat electrode attachment surface.

Although certain preferred embodiments of the present invention have been shown and described in detail, it should be understood that various changes and modifications may be made therein without departing from the invention as defined by the scope of the appended claims.

What is claimed is:

1. A humidity-sensitive actuator comprising:
   a plate made of piezoelectric electrostrictive ceramic having a variable electric resistance region with a higher moisture absorbing capability and defining a flat electrode attachment surface, and a high and fixed electric resistance region with a lower moisture absorbing capability and defining a flat electrode attachment surface, a said variable electric resistance region being joined to said high and fixed electric resistance region with said flat electrode attachment surfaces on opposite sides of said plate for imposing an electrical voltage through said plate for causing flexural displacement of said plate upon changes in humidity exposed to said plate.

2. A humidity-sensitive actuator according to claim 1, wherein said variable electric resistance region comprises a porous piezoelectric electrostrictive ceramic plate and said high and fixed electric resistance region comprises a dense piezoelectric electrostrictive ceramic plate joined to said porous piezoelectric electrostrictive ceramic plate.

3. A humidity-sensitive actuator according to claim 2, wherein said porous piezoelectric electrostrictive ceramic plate is made of PZT having a portion replaced with an amount of $Nb_2O_5$ which is equal to or small than about 2 mole %.

4. A humidity-sensitive actuator according to claim 2 or 3, wherein said dense piezoelectric electrostrictive ceramic plate is made of PZT.

5. A humidity-sensitive actuator according to claim 2, wherein said porous piezoelectric electrostrictive ceramic plate is made of PZT having a portion replaced with an amount of $Nb_2O_5$ which is equal to or small than about 2 mole %, said porous piezoelectric electrostrictive ceramic plate having a relative density of substantially 62%, and wherein said dense piezoelectric electrostrictive ceramic plate is made of PZT and has a relative density of substantially 99%.

6. A humidity-sensitive actuator comprising:
   a first plate made of porous piezoelectric electrostrictive ceramic having a lower relative density for absorbing more moisture;
   a second plate made of dense piezoelectric electrostrictive ceramic having a higher relative density for absorbing less moisture, said first and second plates having joined surfaces, respectively;
   a first electrode mounted on a surface of said first plate opposite to the joined surface thereof; and
   a second electrode mounted on a surface of said second plate opposite to the joined surface thereof.

7. A humidity-sensitive actuator according to claim 6, wherein said first plate is made of PZT having a portion replaced with an amount of $Nb_2O_5$ which is equal to or smaller than about 2 mole %.

8. A humidity-sensitive actuator according to claim 6 or 7, wherein said second plate is made of PZT.

9. A humidity-sensitive actuator according to claim 6, wherein said lower relative density is of substantially 62% and said higher relative density is of substantially 99%.e 10. A humidity-sensitive actuator comprising:
    a plate means of piezoelectric electrostrictive ceramic having a transverse relative density gradient for producing different moisture-dependent electric resistances transversely thereacross;
    a pair of electrodes mounted respectively on opposite surfaces of said plate means; and power supply means for applying a constant voltage across said plate means through said electrodes to develop an electric field gradient transversely across said plate means upon the presence of differing amounts of moisture transversely across said plate means caused by said different moisture-dependent electric resistances for causing said plate means to produce a flexural displacement transversely due to said electric field gradient upon changes in humidity in gases to which said plate means is exposed.

11. A humidity-sensitive actuator according to claim 10, wherein said plate means comprises a porous piezoelectric electrostrictive ceramic plate and a dense piezoelectric electrostrictive ceramic plate joined to said porous electric electrostrictive ceramic plate.

12. A humidity-sensitive actuator according to claim 11, wherein said porous piezoelectric electrostrictive ceramic plate is made of PZT having a portion replaced with an amount of $Nb_2O_5$ which is equal to or small than about 2 mole %.

13. A humidity-sensitive actuator according to claim 11 or 12, wherein said dense piezoelectric electrostrictive ceramic plate is made of PZT.

14. A humidity-sensitive actuator comprising:

a plate of piezoelectric electrostrictive ceramic having a relative density gradient transversely of said plate, and means on transversely opposite sides of said plate for allowing a voltage to be applied transversely across said plate for causing flexural displacement of said plate upon changes in humidity.

15. A humidity-sensitive actuator according to claim 14, wherein said plate comprises a region of porous piezoelectric electrostrictive ceramic and a region of dense piezoelectric electrostrictive ceramic with said regions having a relative density varying transversely across said plate.

16. A humidity-sensitive actuator according to claim 15, wherein said region of porous piezoelectric electrostrictive ceramic is made of PZT having a portion replaced with an amount of $Nb_2O_5$.

17. A humidity-sensitive actuator according to claim 15 or 16, wherein said region of dense piezoelectric electrostrictive ceramic is made of PZT.

18. A humidity-sensitive actuator according to claim 15, wherein said region of porous piezoelectric electrostrictive ceramic has a relative density of about 62%, and wherein said region of dense piezoelectric electrostrictive ceramic plate has a relative density of about 99%.

19. A humidity-sensitive actuator according to claim 1 or 14, wherein said plate has a first end spaced substantially from a second end, means fixedly supporting said first end, and actuating means on said second end for actuating movement of the actuator upon said flexural displacement.

20. A humidity-sensitive actuator according to claim 10, wherein said plate means has a first end spaced substantially from a second end, means fixedly supporting said first end, and actuating means on said second end for actuating movement of the actuator upon said flexural displacement.

21. A humidity-sensitive actuator according to claim 6, wherein a flexural displacement of said joined first and second plates is caused by applying an electrical voltage across said first and second electrodes.

22. A humidity-sensitive actuator according to claim 20, wherein said joined first and second plates have a first end spaced substantially from a second end, means fixedly supporting said first end, and actuating means on said second end for actuating movement of the actuator upon said flexural displacement.

23. A humidity-responsive displacement generator, comprising:

an elongate body of piezoelectric electrostrictive ceramic having a transverse density gradient with a transverse range of different moisture-dependent electric resistances for producing a transverse flexural displacement due to an electric field gradient developed transversely across said elongate body in response to a change in humidity surrounding the elongate body while a constant voltage is being applied transversely across the elongate body.

24. A humidity-responsive displacement generator according to claim 23, wherein said elongate body comprises a porous piezoelectric electrostrictive ceramic plate and a dense piezoelectric electrostrictive ceramic plate joined to said porous piezoelectric electrostrictive ceramic plate.

25. A humidity-responsive displacement generator according to claim 23, wherein said porous piezoelectric electrostrictive ceramic plate is made of PZT having a portion replaced with an amount of $Nb_2O_5$ which is equal to or smaller than about 2 mole %.

26. A humidity-responsive displacement generator according to claim 24 or 25, wherein said dense piezoelectric electrostrictive ceramic plate is made of PZT.

27. A humidity-responsive displacement generator according to claim 24, wherein said porous piezoelectric electrostrictive ceramic plate is made of PZT having a portion replaced with an amount of $Nb_2O_5$ which is equal to or smaller than about 2 mole %, said porous piezoelectric electrostrictive ceramic plate having a relative density of substantially 62%, and wherein said dense piezoelectric electrostrictive ceramic plate is made of PZT and has a relative density of substantially 99%.

28. A humidity-responsive displacement generator, comprising:

an elongate body of piezoelectric electrostrictive ceramic having a plurality of transversely joined regions with respective different-moisture-dependent electric resistances for producing respective different longitudinal displacements, which result in a transverse flexural displacement of said elongate body, due to different electric fields developed transversely across said transversely joined regions, respectively, in response to a change in humidity surrounding the elongate body while a constant voltage is being applied transversely across the elongate body.

29. A humidity-responsive displacement generator according to claim 28, wherein said transversely joined regions include a porous piezoelectric electrostrictive ceramic plate and a dense piezoelectric electrostrictive ceramic plate joined to said porous piezoelectric electrostrictive ceramic plate.

30. A humidity-responsive displacement generator according to claim 29, wherein said porous piezoelectric electrostrictive ceramic plate is made of PZT having a portion replaced with an amount of $Nb_2O_5$ which is equal to or smaller than about 2 mole %.

31. A humidity-responsive displacement generator according to claim 29 or 30, wherein said dense piezoelectric electrostrictive ceramic plate is made of PZT.

32. A humidity-responsive displacement generator according to claim 29, wherein said porous piezoelectric electrostrictive ceramic plate is made of PZT having a portion replaced with an amount of $Nb_2O_5$ which is equal to or smaller than about 2 mole %, said porous piezoelectric electrostrictive ceramic plate having a relative density of substantially 62%, and wherein said dense piezoelectric electrostrictive ceramic plate is made of PZT and has a relative density of substantially 99%.

* * * * *